US012641958B2

(12) United States Patent
Choi et al.

(10) Patent No.: US 12,641,958 B2
(45) Date of Patent: May 26, 2026

(54) ORGANIC LIGHT EMITTING DISPLAY DEVICE WITH HYBRID TYPE THIN FILM TRANSISTORS

(71) Applicant: LG Display Co., Ltd., Seoul (KR)

(72) Inventors: Sung Ju Choi, Paju-si (KR); Jung Seok Seo, Paju-si (KR); Jae Yoon Park, Paju-si (KR); Seo Yeon Im, Paju-si (KR); Jin Won Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 406 days.

(21) Appl. No.: 18/196,189

(22) Filed: May 11, 2023

(65) Prior Publication Data

US 2024/0008308 A1 Jan. 4, 2024

(30) Foreign Application Priority Data

Jun. 30, 2022 (KR) ........................ 10-2022-0080679

(51) Int. Cl.
*H10K 59/121* (2023.01)
*H10D 30/67* (2025.01)
*H10K 59/126* (2023.01)

(52) U.S. Cl.
CPC ..... *H10K 59/1213* (2023.02); *H10D 30/6723* (2025.01); *H10D 30/6729* (2025.01);
(Continued)

(58) Field of Classification Search
CPC .......... H10K 59/1213; H10K 59/1216; H10K 59/126; H10K 59/123; H10K 59/124;
(Continued)

(56) References Cited

U.S. PATENT DOCUMENTS

| | | | |
|---|---|---|---|
| 11,133,366 B2 * | 9/2021 | Gu ...................... | H10D 30/6758 |
| 2017/0352711 A1 * | 12/2017 | Zhang ................ | H10D 86/0221 |

(Continued)

FOREIGN PATENT DOCUMENTS

| | | |
|---|---|---|
| KR | 10-2019-0073848 A | 6/2019 |
| KR | 10-2021-0086247 A | 7/2021 |

OTHER PUBLICATIONS

Ministry of Intellectual Property of Korea, Office Action, Korean Patent Application No. 10-2022-0080679, Oct. 15, 2025, 17 pages.

*Primary Examiner* — Tan N Tran
(74) *Attorney, Agent, or Firm* — Fenwick & West LLP

(57) ABSTRACT

An organic light emitting display device including a substrate, a light emitting element on the substrate, and a driving thin film transistor supplying drive current to the light emitting element is disclosed. The driving thin film transistor includes a buffer layer on the substrate, a first polycrystalline silicon semiconductor layer on the buffer layer, a first oxide semiconductor layer contacting the first polycrystalline silicon semiconductor layer while being disposed thereon and including a first channel region, a first source region, and a first drain region, a gate insulating layer covering the first oxide semiconductor layer and the first polycrystalline silicon semiconductor layer, a first gate electrode disposed on the gate insulating layer, a first source electrode connected to the first source region, a first drain electrode connected to the first drain region, and a first light shielding layer disposed under the first oxide semiconductor layer while overlapping therewith.

29 Claims, 5 Drawing Sheets

(52) U.S. Cl.
CPC ....... *H10D 30/673* (2025.01); *H10D 30/6745* (2025.01); *H10D 30/6755* (2025.01); *H10K 59/1216* (2023.02); *H10K 59/126* (2023.02)

(58) Field of Classification Search
CPC ............ H10K 77/111; H10K 2102/311; H10D 30/6723; H10D 30/6729; H10D 30/673; H10D 30/6745; H10D 30/6755; H10D 30/6757; H10D 86/021; H10D 86/423; H10D 86/427; H10D 86/60; H10D 86/441; H10D 86/451; H10D 86/481; H10D 86/425; G09G 3/3233
See application file for complete search history.

(56) References Cited

U.S. PATENT DOCUMENTS

2019/0189720 A1 6/2019 Lim et al.
2021/0202634 A1 7/2021 Moon et al.
2024/0381726 A1* 11/2024 Wang ................. H10K 59/1315

* cited by examiner

FIG. 5
FIG. 6
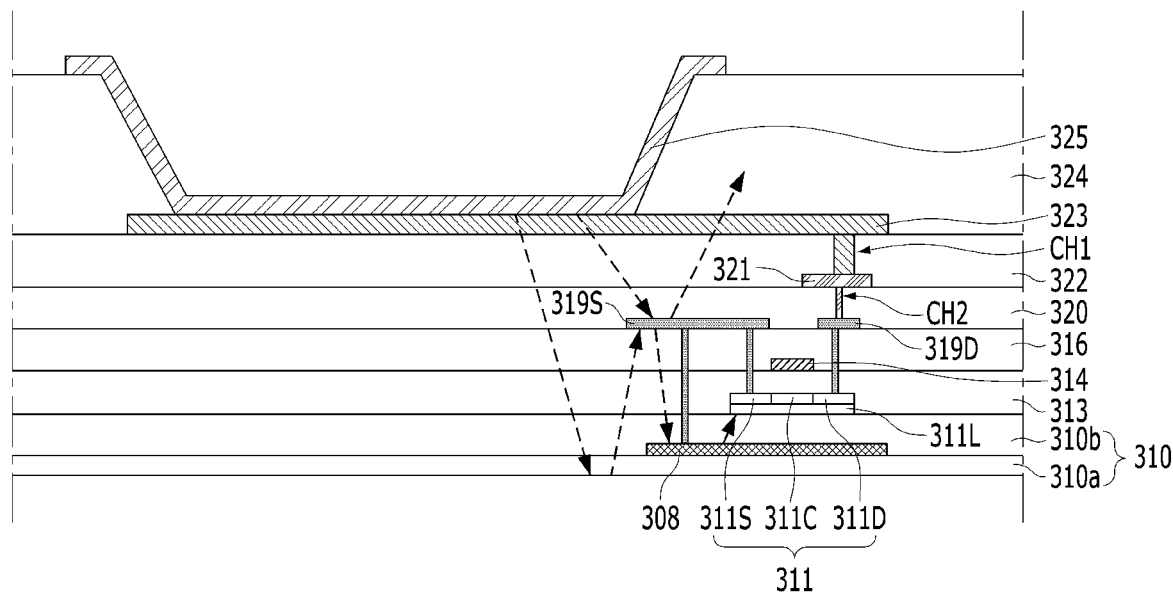
FIG. 7

ORGANIC LIGHT EMITTING DISPLAY DEVICE WITH HYBRID TYPE THIN FILM TRANSISTORS

CROSS-REFERENCE TO RELATED APPLICATION

This application claims the benefit and priority of Republic of Korea Patent Application No. 10-2022-0080679, filed on Jun. 30, 2022, which is hereby incorporated by reference in its entirety.

BACKGROUND

Technical Field

The present disclosure relates to an organic light emitting display device, and more particularly to an organic light emitting display device in which at least one of thin film transistors constituting a driving circuit of a unit pixel includes a hybrid type thin film transistor configured using different kinds of semiconductor materials.

Discussion of the Related Art

Currently, active research on an organic light emitting display (OLED) device configured to self-luminously emit light is being conducted for substitution of the OLED device for a liquid crystal display (LCD) device.

An application range of such a display device is wide. Currently, a display device, which is applicable to products having various areas ranging from a miniature electronic appliance to an ultra-large billboard and may have a reduced volume and a reduced weight in accordance with a specific product, is required.

SUMMARY

In connection with those described above, an organic light emitting display device, which is capable of realizing a relatively thin and light display device, may constitute screens of various types capable of being bent, folded or rolled because a light emitting element may be formed on a flexible substrate in the case of the organic light emitting display device.

In addition, a light emitting display device, which includes a new type driving circuit capable of reducing or preventing generation of leakage current in the case of a still image, thereby achieving a reduction in power consumption, is required for application thereof to a display device, such as a smartwatch or a menu board, on which still images are mainly displayed.

In connection with configuration of such a driving circuit, a scheme in which a thin film transistor using an oxide semiconductor advantageous in blocking of leakage current has been proposed.

Accordingly, the present disclosure is directed to an organic light emitting display device that substantially obviates one or more limitations or problems due to limitations and disadvantages of the related art.

In the case of a display device including thin film transistors using different kinds of semiconductor layers, for example, a polycrystalline silicon semiconductor layer and an oxide semiconductor layer, a process of forming the polycrystalline silicon semiconductor layer and a process of forming the oxide semiconductor layer may be separately performed and, as such, the overall process becomes complex. Furthermore, the polycrystalline silicon semiconductor layer and the oxide semiconductor layer have different characteristics with respect to the same chemical gas and, as such, a more complex process is required.

The polycrystalline silicon semiconductor layer exhibits a higher movement speed of carriers such as electrons and holes, as compared to the oxide semiconductor layer. In this regard, the polycrystalline silicon semiconductor layer is suitable for a driving thin film transistor requiring rapid driving. In general cases, accordingly, the driving thin film transistor is implemented using the polycrystalline silicon semiconductor layer.

However, the driving thin film transistor, which uses the polycrystalline silicon semiconductor layer, has a limitation or problem in that there is a disadvantage in terms of low-grayscale expression because current fluctuation caused by current stress is great, in spite of a high driving speed. Therefore, an object of the disclosure is to provide a driving device in which a driving thin film transistor is implemented using an oxide semiconductor, thereby being capable of reducing current fluctuation caused by current stress, and increasing an s-factor value representing a charging rate of a voltage provided to a pixel electrode.

Another object of the disclosure is to provide a driving thin film transistor using an oxide semiconductor, thereby being capable of securing a high threshold voltage and optical reliability for stable long-term driving.

Additional objects, and features of the disclosure will be set forth in part in the description which follows and in part will become apparent to those having ordinary skill in the art upon examination of the following or may be learned from practice of the disclosure. The objectives and other features of the disclosure may be realized and attained by the structure particularly pointed out in the written description and claims hereof as well as the appended drawings.

To achieve these objects and other features and in accordance with the purpose of the disclosure, as embodied and broadly described herein, an organic light emitting display device includes a substrate, a light emitting element disposed on the substrate, and a driving thin film transistor configured to supply drive current to the light emitting element. The driving thin film transistor includes a buffer layer disposed on the substrate, a first polycrystalline silicon semiconductor layer disposed on the buffer layer, a first oxide semiconductor layer contacting the first polycrystalline silicon semiconductor layer while being disposed thereon and comprising a first channel region, a first source region, and a first drain region, a gate insulating layer covering the first oxide semiconductor layer and the first polycrystalline silicon semiconductor layer, a first gate electrode disposed on the gate insulating layer, a first source electrode connected to the first source region, a first drain electrode connected to the first drain region, and a first light shielding layer overlapping with the first oxide semiconductor layer while being disposed thereunder. Accordingly, the driving thin film transistor may secure optical reliability and may achieve an enhancement in performance.

In another aspect of the present disclosure, there is provided an organic light emitting display device including a flexible substrate, a first light shielding layer disposed on the flexible substrate, a first polycrystalline silicon semiconductor layer overlapping with the first light shielding layer while being disposed thereon, a first oxide semiconductor layer contacting the first polycrystalline silicon semiconductor layer while being disposed thereon, a first gate electrode disposed on the first oxide semiconductor layer, a source electrode connected to one side of the first semiconductor layer, and a drain electrode connected to another side of the first semiconductor layer. Accordingly, the driving thin film transistor may secure optical reliability and may achieve an enhancement in performance.

Objects of the present disclosure are not limited to the above-described objects, and other objects of the present disclosure not yet described will be more clearly understood by those skilled in the art from the following detailed description.

It is to be understood that both the foregoing general description and the following detailed description of are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain various principles of the disclosure. In the drawings:

FIG. 3 is a cross-sectional view of the display device according to the exemplary embodiment of the present disclosure;

FIG. 4 is a cross-sectional view of a display device according to another exemplary embodiment of the present disclosure;

FIG. 5 is a cross-sectional view of a driving thin film transistor according to an exemplary embodiment of the present disclosure;

FIG. 6 is a circuit diagram representing a relation between parasitic capacitances generated in the driving thin film transistor according to an exemplary embodiment of the present disclosure;

FIG. 7 is a cross-sectional view schematically showing a total reflection path of external light in the display device according to an exemplary embodiment of the present disclosure.

Figure 1:
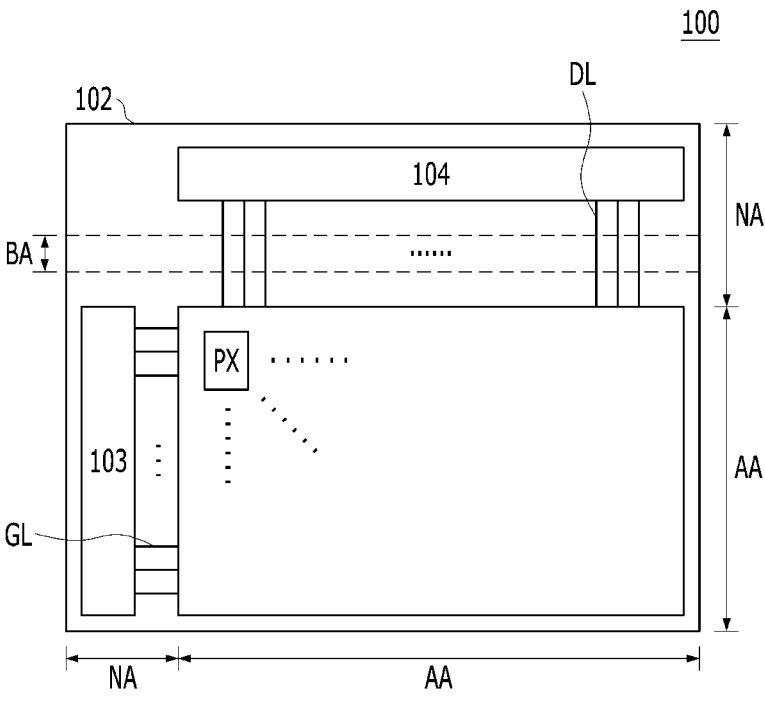
FIG. 1 is a block diagram of a display device according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure and methods for achieving the same will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art. Further, the present disclosure is only defined by scopes of claims and their equivalents.

In the drawings for explaining the embodiments of the present disclosure, for example, the illustrated shape, size, areas, ratio, angle, and number are given by way of example, and thus, the present disclosure is not limited thereto. Throughout the present specification, the same reference numerals designate the same constituent elements. The relative size and depiction of these elements may be exaggerated for clarity, illustration, and convenience. In addition, in the following description of the present disclosure, a detailed description of known functions and configurations incorporated herein will be omitted or briefly provided when it may make the subject matter of the present disclosure rather unclear. The terms "comprises," "contain," "constitute," "make up of," "formed of," "includes," and/or "has", used in this specification, do not preclude the presence or addition of other elements unless used along with the term such as "only". The singular forms are intended to include the plural forms as well, unless the context clearly indicates otherwise.

Any implementation described herein as an "example" is not necessarily to be construed as preferred or advantageous over other implementations.

In the interpretation of constituent elements included in the various embodiments of the present disclosure, the constituent elements are interpreted as including an error range or tolerance range even if there is no explicit description thereof.

In the description of the various embodiments of the present disclosure, when describing positional relationships, for example, when the positional relationship between two parts is described using "on", "over", "above", "below", "under", "beside", "beneath", "near", "close to", "adjacent to", "next to", or the like, one or more other parts may be located between the two parts unless the term such as "immediately", "directly" or "closely" is used.

The term "on" should be construed as including a case where one element or layer is formed at a top of another element or layer and moreover a case where a third element is disposed therebetween. The terms, such as "below," "lower," "above," "upper" and the like, may be used herein to describe a relationship between item(s) as illustrated in the drawings. It will be understood that the terms are spatially relative and based on the orientation depicted in the drawings.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It may be understood that, although the terms "first", "second", "A", "B", "(a)", and "(b)" etc. may be used herein to describe various elements, these elements are not to be limited by these terms. These terms are merely used to distinguish one element from another. Therefore, in the present specification, an element indicated by "first" may be the same as an element indicated by "second" without exceeding the technical scope of the present disclosure, unless otherwise mentioned.

The term "at least one" should be understood as including any and all combinations of one or more of the associated listed items. For example, the meaning of "at least one of a first element, a second element, and a third element" compasses the combination of all three listed elements, combinations of any two of the three elements, as well as each individual element, the first element, the second element, or the third element.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Wherever possible, the same reference numbers will be used throughout the drawings to refer to the same or like parts.

It will be apparent to those skilled in the art that various modifications and variations can be made in the present disclosure without departing from the technical idea or scope of the disclosures. Thus, it may be intended that embodiments of the present disclosure cover the modifications and variations of the disclosure provided they come within the scope of the appended claims and their equivalents.

In some embodiments of the present disclosure, a source electrode and a drain electrode are distinguished from each other for convenience of description, and may be interchanged with each other. The source electrode may be changed to the drain electrode, and the drain electrode may be changed to the source electrode. In addition, a source electrode in one embodiment may be changed to a drain electrode in another embodiment, and a drain electrode in one embodiment may be changed to a source electrode in another embodiment.

In some embodiments of the present disclosure, for convenience of description, a source region and a source electrode are distinguished from each other, and a drain region and a drain electrode are distinguished from each other. However, embodiments of the present disclosure are not limited to the above-described conditions. The source region may be changed to the source electrode, and the drain region may be changed to the drain electrode. In addition, the source region may be changed to the drain electrode, and the drain region may be changed to the source electrode.

The area and thickness of each element shown in the drawings are given merely for convenience of description, and embodiments of the present disclosure are not limited thereto.

The respective features of the various embodiments of the present disclosure may be partially or entirely coupled to and combined with each other, and various technical linkages and modes of operation thereof are possible. These various embodiments may be performed independently of each other, or may be performed in association with each other.

Hereinafter, embodiments of the present disclosure will be described in detail with reference to the accompanying drawings.

FIG. 1 is a block diagram of a display device 100 according to an exemplary embodiment of the present disclosure.

Referring to FIG. 1, the display device 100 according to the embodiment of the present disclosure may include a display panel 102, a printed circuit board including driving circuits configured to transmit voltages and signals to the display panel 102, and structures for mounting of the display panel 102. The display panel 102 may include an active area AA, and a non-active area NA, that is, a peripheral area adjacent to (e.g., around) the active area AA.

The display panel 102 includes a substrate. In an example, the substrate may be formed of a plastic material having flexibility such that the substrate is bendable. For example, the substrate may be made of polyimide (PI), polyethylene terephthalate (PET), polyethylene naphthalate (PEN), polycarbonate (PC), polyethersulfone (PES), polyarylate (PAR), polysulfone (PSF), cyclic-olefin copolymer (COC), or the like. In addition, a very thin glass may be used in order to enable bending of the display panel 102. But embodiments are not limited thereto. For example, the substrate may be formed of a rigid material. In this case, the display panel may be not bendable.

A plurality of sub-pixels PX for realization of a screen is disposed in the active area AA. Each of the sub-pixels PX includes a light emitting element, and a pixel driving circuit configured to apply drive current to the light emitting element. In addition, the pixel driving circuit is implemented by thin film transistors. In an example, at least one of the thin film transistors may use an oxide semiconductor material as an active layer thereof. In another example, each of the thin film transistors may use an oxide semiconductor material as an active layer thereof. But embodiments are not limited thereto. For example, at least one of the thin film transistors may use other semiconductor materials (e.g., polycrystalline semiconductor material) as an active layer thereof.

At least one of a data driver 104 (e.g., a circuit) and a gate driver 103 (e.g., a circuit) may be disposed in the non-active area NA. In an example, the display panel 102 may further include a bending area BA disposed in the non-active area NA. In the bending area BA, the display panel 102 may be bent. The display panel 102 may also include no bending area BA, or more than one bending areas BA.

The gate driver 103 may be (e.g., directly) formed on a substrate as a (e.g., p-channel) metal oxide semiconductor (e.g., PMOS) circuit implemented by a thin film transistor using a polycrystalline semiconductor material as an active layer thereof or an oxide semiconductor material as an active layer thereof, or may be (e.g., directly) formed on a substrate as a complementary metal oxide semiconductor (CMOS) circuit implemented by both a thin film transistor using a polycrystalline semiconductor material as an active layer thereof and a thin film transistor using an oxide semiconductor material as an active layer thereof. When the same semiconductor material is used for thin film transistors respectively disposed in the non-active area NA and the active area AA, the active layer of each thin film transistors may be simultaneously formed using the same process. Alternatively, the gate driver 103 may be mounted in a gate in display area (GIA) method between the plurality of sub-pixels SP in the display area AA.

A thin film transistor having a polycrystalline silicon semiconductor layer may achieve high resolution and low-power driving because high electron mobility is exhibited in a channel.

A plurality of data lines DL and a plurality of gate lines GL may be disposed in the active area AA. For example, the plurality of data lines DL may be disposed in columns, and the plurality of gate lines GL may be disposed in rows. Each of the data lines DL and each of the gate lines GL may be connected to the driving circuit included in one of the sub-pixels PX.

The gate driver 103, which includes a gate driving circuit, may be disposed in the non-active area NA. The gate driving circuit of the gate driver 103 sequentially supplies a scan signal and/or an emission signal to the plurality of gate lines GL, thereby sequentially driving pixel rows of the active area AA. The gate driving circuit may include a scan driving circuit configured to provide a scan signal, and may further include an emission driving circuit configured to provide an emission signal. In this case, one pixel row represents a row constituted by pixels connected to one gate line GL.

The gate driving circuit may include a shift register, a level shifter, etc.

In the display device 100 according to the exemplary embodiment of the present disclosure, the gate driving circuit may be implemented as a gate-in-panel (GIP) type and, as such, may be directly disposed on a substrate.

The gate driver 103 sequentially supplies a scan signal of an on-voltage or an off-voltage and/or an emission signal to the plurality of gate lines GL.

The data driver 104, which is included in the display device 100 according to the exemplary embodiment of the present disclosure, converts image data into a data voltage having an analog form when an on-voltage is supplied to a particular one of the gate lines GL by the gate driver 103. The data driver 104 then supplies the data voltage to the plurality of data lines DL.

The plurality of gate lines GL disposed on the substrate may include a plurality of scan lines, and/or a plurality of emission lines, etc. Each of the plurality of scan lines is a line configured to transmit a scan signal to a gate node of a scan transistor. Each of the plurality of emission lines is a line configured to transmit an emission signal to a gate node of an emission transistor.

The data lines DL are connected between the sub-pixels PX and the data driver 104, for example, by passing through the bending area BA. In detail, each of the data lines DL may be connected to a data pad connected to the data driver 104.

The bending area BA is an area where the substrate is capable of being curved through bending according to an embodiment. The substrate may be maintained in a flat state in an area except for the bending area BA. As an example, a portion of the non-active area NA may be disposed at a back surface of the active area AA to overlap with the active area AA by the bending area BA.

Figure 2:
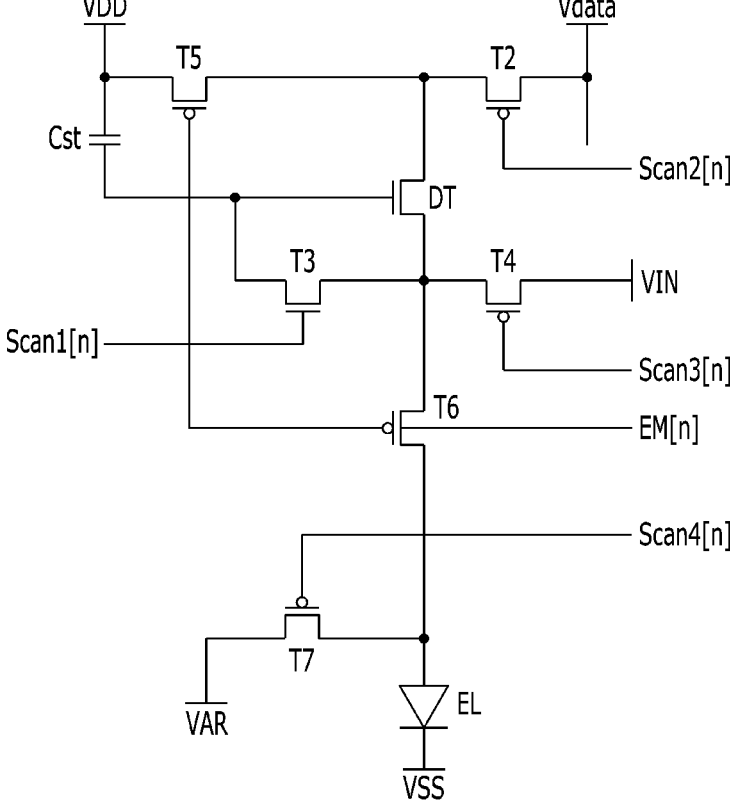
FIG. 2 is a circuit diagram showing a pixel driving circuit included in the display device according to an exemplary embodiment of the present disclosure.

FIG. 2 is a circuit diagram showing a pixel driving circuit included in the display device 100 according to an exemplary embodiment of the present disclosure.

Referring to FIG. 2, the display device 100 according to the embodiment of the present disclosure may include a pixel driving circuit constituted by a plurality (e.g., seven) of thin film transistors DT, T2, T3, T4, T5, T6, and T7, and a storage capacitor Cst. One of the seven thin film transistors DT, T2, T3, T4, T5, T6, and T7 is a driving thin film transistor DT, and the remaining ones of the thin film transistors DT, T2, T3, T4, T5, T6, and T7 are switching thin film transistors T2, T3, T4, T5, T6, and T7 for degradation compensation of the driving thin film transistor DT or a light emitting element EL and driving of the driving thin film transistor DT. The pixel driving circuit applies drive current to the light emitting element EL. The light emitting element EL may be an organic light emitting element or an inorganic light emitting element. For example, the light emitting element EL may be a device using an organic light emitting diode, a micro light emitting diode (micro-LED), a light emitting diode (LED), quantum dots, etc. In present embodiment, pixel driving circuit may have a 7T1C structure comprised of seven transistors and a single capacitor, but is not limited thereto. The structure of pixel driving circuit may be selected from among 3T1C, 4T1C, 5T1C, 6T1C, 3T2C, 4T2C, 5T2C, 6T2C, 7T2C, 8T2C and the like structures.

In an exemplary embodiment of the present disclosure, the pixel driving circuit is implemented such that the pixel driving circuit is connected to an anode of the light emitting element EL, to apply drive current to the anode. However, the embodiments of the present disclosure are not limited to such a configuration. For example, in another embodiment of the present disclosure, the pixel driving circuit may be implemented such that the pixel driving circuit is connected to a cathode of the light emitting element EL.

In an exemplary embodiment of the present disclosure, the pixel driving circuit includes a configuration in which an oxide semiconductor material is used for an active layer of the driving thin film transistor DT and an active layer of the third switching thin film transistor T3 connected to one or more of a gate electrode, a source electrode and a drain electrode constituting the driving thin film transistor DT. In addition, at least one of the remaining switching thin film transistors T2, T4, T5, T6, and T7 for compensation of the driving transistor DT may use a polycrystalline semiconductor material as an active layer thereof.

The switching thin film transistors T2, T3, T4, T5, T6, and T7, which will be described hereinafter, may be simply referred to as "switching transistors" or "transistors", and the driving thin film transistor DT may also be referred to as a "driving transistor".

A gate line disposed in an n-th pixel row included in the display device 100 according to the exemplary embodiment of the present disclosure may include lines for transmitting a first scan signal Scan1[n], a second scan signal Scan2[n], a third scan signal Scan3[n], a fourth scan signal Scan4[n], and an emission signal EM[n]. In this case, the fourth scan signal Scan4[n] may be connected to a third scan signal disposed in an (n+1)-th pixel row.

The first scan signal Scan1[n] controls turn-on and turn-off of the third transistor T3. The second scan signal Scan2[n] controls turn-on and turn-off of the second transistor T2. The third scan signal Scan3[n] controls turn-on and turn-off of the fourth transistor T4. The fourth scan signal Scan4[n] controls turn-on and turn-off of the seventh transistor T7. The emission signal EM[n] controls turn-on and turn-off of the fifth transistor T5 and the sixth transistor T6.

In addition to the gate line, a data line and power lines are disposed at the pixel driving circuit. The data line is connected to the second transistor T2, and supplies a data voltage Vdata to the drain electrode of the driving transistor DT. The power lines include an initialization line configured to supply an initialization voltage VIN, a high-voltage line configured to supply a high-level voltage VDD, a low-voltage line configured to supply a low-level voltage VSS, and an anode reset voltage line configured to supply an anode reset voltage VAR.

The initialization voltage VIN is supplied to the source electrode of the driving transistor DT via the fourth transistor T4. The high-level voltage VDD is supplied to one electrode of the capacitor Cst or is supplied to the drain electrode of the driving transistor DT via the fifth transistor T5. The low-level voltage VSS is supplied to the cathode of the light emitting element EL. The anode reset voltage VAR is supplied to the anode of the light emitting element EL via the seventh transistor T7.

The embodiments of the present disclosure are not limited to the pixel driving circuit of FIG. 2, and may be applicable to an internal compensation circuit or an external compensation circuit having various configurations.

Figure 3:
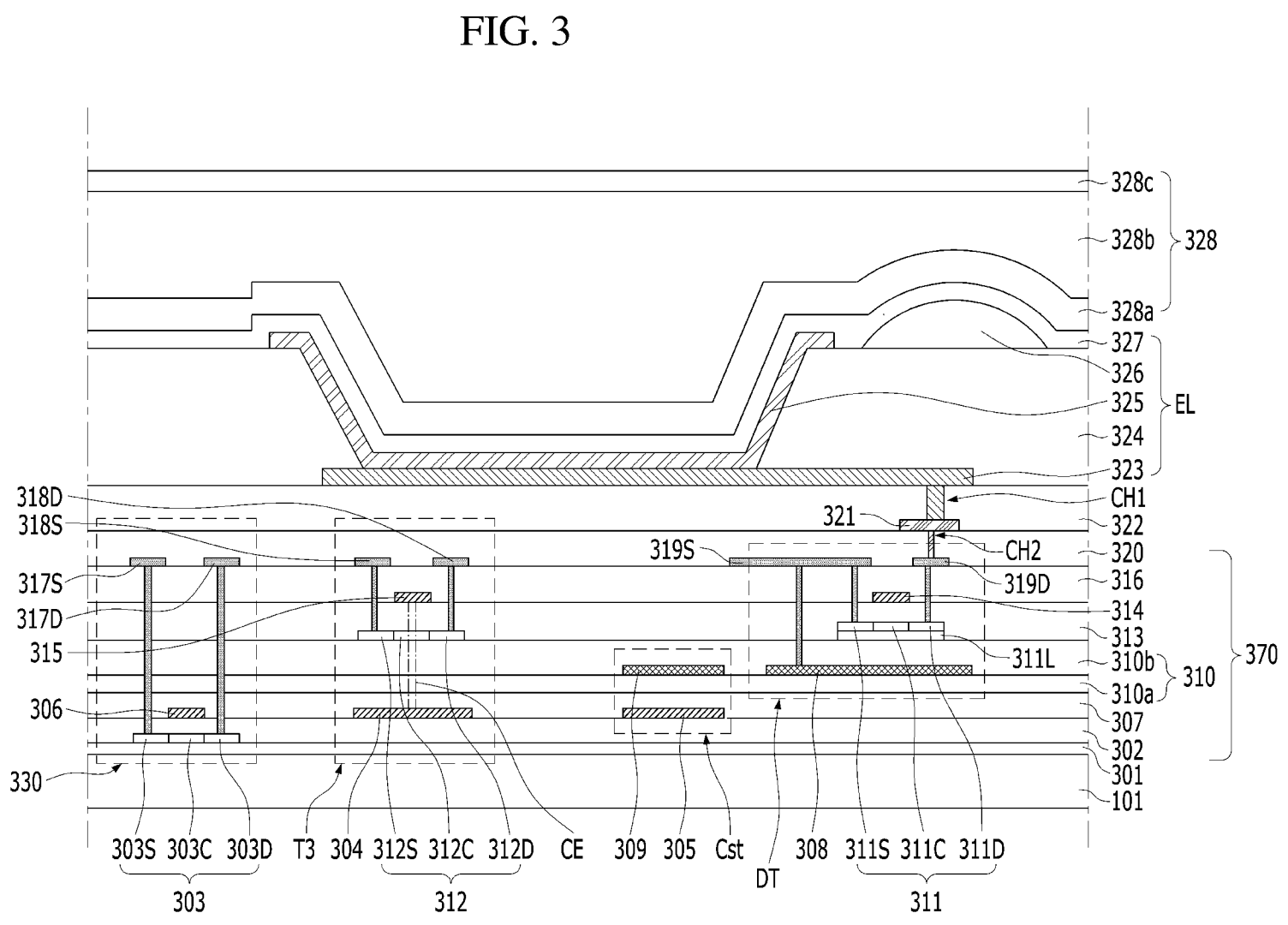

FIG. 3 is a cross-sectional view of the display device 100 according to the embodiment of the present disclosure.

Referring to FIG. 3, a cross-sectional view including one driving thin film transistor DT, two switching thin film transistors T3 and 330, and one capacitor Cst is shown. The two switching thin film transistors T3 and 330 include the third switching thin film transistor T3, which includes an oxide semiconductor material, and a switching thin film transistor 330, which is one of the switching thin film transistors T2, T4, T5, T6, and T7 including a polycrystalline semiconductor material. In this case, the third switching thin film transistor T3 may be referred to as an "oxide switching thin film transistor T3", and each of the switching thin film transistors including the polycrystalline semiconductor material may be referred to as a "polycrystalline switching thin film transistor 330". Although the following description regarding the "oxide switching thin film transistor" is mainly associated with third switching thin film transistor T3, the same or similar description could be also applied to other thin film transistors in which an oxide semiconductor material is used for an active layer, connected to or not connected to the driving thin film transistor DT, such as one of the switching thin film transistors T2, T4, T5, T6, and T7 including an oxide semiconductor material.

As described above, one sub-pixel PX includes a light emitting element EL, and a pixel driving circuit 370 configured to apply drive current to the light emitting element EL. The pixel driving circuit 370 is disposed on a substrate 101, and the light emitting element EL is disposed on the pixel driving circuit 370. In an example, an encapsulation layer 328 is disposed on the light emitting element EL. The encapsulation layer 328 protects the light emitting element EL.

The pixel driving circuit 370 may represent an array part of one sub-pixel PX including a driving thin film transistor DT, switching thin film transistors T3 and 330, and a capacitor Cst. In addition, the light emitting element EL may represent an array part for light emission including an anode 323, a cathode 327, and a light emitting layer 325 disposed between the anode 323 and the cathode 327.

In an embodiment of the present disclosure, the driving thin film transistor DT and at least one of the switching thin film transistors T3 and 330 use an oxide semiconductor as an active layer thereof. In the case of a thin film transistor using an oxide semiconductor material as an active layer thereof, a leakage current blocking effect is excellent, and manufacturing costs are low, as compared to those of a thin film transistor using a polycrystalline semiconductor material as an active layer thereof. In order to reduce power consumption and manufacturing costs, therefore, the pixel driving circuit 370 according to the embodiment of the present disclosure includes the driving thin film transistor DT and the at least one of the switching thin film transistor T3 and 330 which use an oxide semiconductor material.

All thin film transistors constituting the pixel driving circuit 370 may be implemented using an oxide semiconductor material, or only a part of the switching thin film transistors may be implemented using an oxide semiconductor material.

Of course, the thin film transistor using the oxide semiconductor material may have difficulty securing reliability, whereas the thin film transistor using the polycrystalline semiconductor material exhibits a rapid operation speed and excellent reliability. Accordingly, the embodiment of the present disclosure includes both the switching thin film transistor using the oxide semiconductor material and the switching thin film transistor using the polycrystalline semiconductor material.

The substrate 101 may be embodied as a multilayer structure in which an organic layer and an inorganic layer are alternately stacked. For example, in the substrate 101, an organic layer made of, for example, polyimide, and an inorganic layer made of, for example, silicon oxide ($SiO_2$), may be alternately stacked. But embodiments are not limited thereto. For example, the substrate 101 may be embodied as a single layer structure of an organic layer or an inorganic layer.

A lower buffer layer 301 is formed on the substrate 101. The lower buffer layer 301 functions to block or at least reduce moisture or the like penetrating from an outside thereof. The lower buffer layer 301 may be formed by stacking a silicon oxide ($SiO_2$) layer to form a multilayer structure. Alternatively, lower buffer layer 301 may include, for example, an inorganic insulating material such as silicon nitride (SiNx) and silicon oxide (SiOx) or an organic insulating material such as benzocyclobutene, an acrylic resin, an epoxy resin, a phenolic resin, a polyamide resin, and a polyimide resin, but is not limited thereto. In addition, the lower buffer layer 301 could be omitted as necessary.

An auxiliary buffer layer may further be disposed on the lower buffer layer 301 in order to protect the element from moisture penetration.

The polycrystalline switching transistor 330 is formed on the substrate 101. The polycrystalline switching thin film transistor 330 may use a polycrystalline semiconductor as an active layer thereof. The polycrystalline switching thin film transistor 330 includes a first active layer 303 including a channel, through which electrons or holes move, a first gate electrode 306, a first source electrode 317S, and a first drain electrode 317D.

The first active layer 303 includes a first channel region 303C, and a first source region 303S disposed at one side of the first channel region 303C, and a first drain region 303D disposed at the other side of the first channel region 303C under the condition that the first channel region 303C is disposed therebetween.

Each of the first source region 303S and the first drain region 303D is a region having conductivity through doping of an intrinsic polycrystalline semiconductor material with group-V or III impurity ions, for example, phosphorous (P) or boron (B) ions.

The first channel region 303C is a region in which a polycrystalline semiconductor material maintains an intrinsic state, and provides a path through which electrons or holes move.

Meanwhile, the polycrystalline switching thin film transistor 330 includes the first gate electrode 306 overlapping with the first channel region 303C of the first active layer 303. A first gate insulating layer 302 is disposed between the first gate electrode 306 and the first active layer 303.

In an embodiment of the present disclosure, the polycrystalline thin film transistor 330 has a top gate structure in which the first gate electrode 306 is disposed over the first active layer 303. Accordingly, the first electrode 305 included in the capacitor Cst and a second light shielding layer 304 optionally included in the oxide switching thin film transistor T3 may be formed using the same material as that of the first gate electrode 306 in the same process. The first gate electrode 306, the first electrode 305, and the second light shielding layer 304 may be formed through one mask process and, as such, the number of mask processes may be reduced.

The first gate electrode 306 is made of a metal material. For example, the first gate electrode 306 may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, without being limited thereto.

A first interlayer insulating layer 307 is disposed on the first gate electrode 306. In an example, the first interlayer insulating layer 307 may be implemented using silicon nitride ($SiN_x$) In particular, the first interlayer insulating layer 307 formed of silicon nitride ($SiN_x$) may include hydrogen particles. When the first active layer 303, the first gate insulating layer 302, and the first gate electrode 306 are formed, the first interlayer insulating layer 307 is deposited over the resultant structure, and a thermal treatment process is then performed, hydrogen particles included in the first interlayer insulating layer 307 may penetrate into the first source region 303S and the first drain region 303D and, as such, may contribute to enhancement and stabilization of conductivity of the polycrystalline semiconductor material. This process may often be referred to as a "hydrogenation process".

The polycrystalline switching thin film transistor 330 may further include an upper buffer layer 310, a second gate insulating layer 313, and a second interlayer insulating layer 316 sequentially disposed on the first interlayer insulating layer 307. The polycrystalline switching thin film transistor 330 includes a first source electrode 317S and a first drain electrode 317D formed on the second interlayer insulating layer 316 and respectively connected to the first source region 303S and the first drain region 303D via contact holes formed in an upper buffer layer 310, a second gate insulating layer 313, a second interlayer insulating layer 316, the first interlayer insulating layer 307 and first gate insulating layer 302.

Each of the first source electrode 317S and the first drain electrode 317D may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, without being limited thereto.

The upper buffer layer 310 spaces a second active layer 312 of the oxide switching thin film transistor T3 and a third active layer 311 of the driving thin film transistor DT, which are implemented using an oxide semiconductor material, apart from the first active layer 303 implemented using a polycrystalline semiconductor material, and provides a base for formation of the second active layer 312 and the third active layer 311.

The second interlayer insulating layer 316 covers a second gate electrode 315 of the oxide switching thin film transistor T3 and a third gate electrode 314 of the driving thin film transistor DT. The second interlayer insulating layer 316 is implemented using an inorganic layer because the second interlayer insulating layer 316 is formed over the second active layer 312 and the third active layer 311 implemented using an oxide semiconductor material. For example, the second interlayer insulating layer 316 may be made of silicon oxide ($SiO_2$).

The second gate electrode 315 may be made of a metal material. For example, the second gate electrode 315 may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, without being limited thereto.

Meanwhile, the oxide switching thin film transistor T3 includes the second active layer 312, which is formed on the upper buffer layer 310 and is implemented using an oxide semiconductor material, the second gate insulating layer 313, which covers the second active layer 312, the second gate electrode 315, which is disposed on the second gate insulating layer 313, the second interlayer insulating layer 316, which covers the second gate electrode 315, and a second source electrode 318S and a second drain electrode 318D, which are disposed on the second interlayer insulating layer 316.

The second active layer 312 includes a second channel region 312C implemented using an oxide semiconductor material without being doped with impurities, to be intrinsic, and a second source region 312S and a second drain region 312D which have conductivity through doping thereof with impurities.

The oxide switching thin film transistor T3 further includes the second light shielding layer 304 which is disposed under the upper buffer layer 310 while overlapping with the second active layer 312. The second light shielding layer 304 may be formed of the same material as that of the first gate electrode 306, and may be formed at an upper surface of the first gate insulating layer 302.

The second light shielding layer 304 may be electrically connected to the second gate electrode 315 and, as such, may constitute a dual gate. A connecting electrode CE may be separately provided in order to electrically interconnect the second light shielding layer 304 and the second gate electrode 315. The connecting electrode CE may be disposed by forming a contact hole at the first interlayer insulating layer 307, the upper buffer layer 310, and the second gate insulating layer 313 under the condition that the contact hole bypasses the second active layer 312. Accordingly, the oxide switching thin film transistor T3 may be implemented as a dual gate structure and, as such, may more precisely control a flow of current flowing through the second channel layer 312C while being manufactured to have a reduced size. Thus, a display device having high resolution may be realized.

The second source electrode 318S and the second drain electrode 318D may be formed on the second interlayer insulating layer 316 simultaneously with the first source electrode 317S and the first drain electrode 317D while using the same material as that of the first source electrode 317S and the first drain electrode 317D in the same process. Accordingly, the number of mask processes may be reduced.

Meanwhile, the driving thin film transistor DT is formed over the upper buffer layer 310.

The driving thin film transistor DT according to the exemplary embodiment of the present disclosure includes the third active layer 311 implemented using an oxide semiconductor material.

In the case of a driving thin film transistor using a polycrystalline semiconductor material which is advantageous in terms of high-speed operation as an active layer thereof, power consumption is great due to generation of leakage current in an off state of the driving thin film transistor. Therefore, the driving thin film transistor DT according to the embodiment of the present disclosure uses an oxide semiconductor material which is advantageous in terms of reduction or prevention of leakage current generation as an active layer thereof.

In the case of a thin film transistor using an oxide semiconductor material as an active layer, failure may occur in a low-grayscale region requiring precise current control because the oxide semiconductor material exhibits a great current fluctuation value with respect to a unit voltage fluctuation value due to characteristics thereof. In an embodiment of the present disclosure, therefore, a driving thin film transistor exhibiting, at an active layer thereof, a relatively small current fluctuation value with respect to a voltage fluctuation value applied to a gate electrode is provided.

Referring to FIG. 3, the driving thin film transistor DT includes the third active layer 311, which is implemented on the upper buffer layer 310 using an oxide semiconductor material, the second gate insulating layer 313, which covers the third active layer 311, the third gate electrode 314, which is formed on the second gate insulating layer 313 while overlapping with the third active layer 311, the second interlayer insulating layer 316, which covers the third gate electrode 314, and a third source electrode 319S and a third drain electrode 319D, which are disposed on the second interlayer insulating layer 316.

The driving thin film transistor DT further includes a first light shielding layer 308. As an example, the first light shielding layer 308 may be disposed in the upper buffer layer 310 while overlapping with the third active layer 311. The first light shielding layer 308 could be omitted as necessary. The first light shielding layer 308 has a structure in which the first light shielding layer 308 is embedded in the upper buffer layer 310. The structure in which the first light shielding layer 308 is embedded in the upper buffer layer 310 will be described in more detail. The upper buffer layer 310 includes a first upper buffer layer 310a and a second upper buffer layer 310b. The first light shielding layer 308 is formed over the first upper buffer layer 310a that is disposed on the first interlayer insulating layer 307. In addition, the second upper buffer layer 310b is formed on the first upper buffer layer 310a, to completely cover the first light shielding layer 308 at a top side of the first light shielding layer 308. The first upper buffer layer 310a and the second upper buffer layer 310b may be implemented using an organic or inorganic layer. As an example, the first upper buffer layer 310a and the second upper buffer layer 310b may be implemented using silicon oxide ($SiO_2$).

The first light shielding layer 308 may be disposed vertically under the third active layer 311, to overlap with the third active layer 311. In addition, the first light shielding layer 308 may be formed to have a greater size than that of the third active layer 311, to completely overlap with the third active layer 311.

The first light shielding layer 308 may be formed on the first upper buffer layer 310a using the same material as that of the second electrode 309 in the same process. The second electrode 309 is disposed to overlap with the first electrode 305 and, as such, constitutes the capacitor Cst.

For example, each of the first light shielding layer 308 and the second electrode 309 may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, without being limited thereto.

The capacitor Cst stores, for a predetermined period, a data voltage applied thereto through a data line, and then supplies the stored data voltage to the light emitting element EL.

The capacitor Cst includes two electrodes facing each other, and a dielectric disposed between the two electrodes. The first interlayer insulating layer 307 and the first upper buffer layer 310a are disposed between the first electrode 305 and the second electrode 309.

The first electrode 305 of the capacitor Cst may be electrically connected to the third gate electrode 314 of the driving thin film transistor DT. Of course, the embodiments of the present disclosure are not limited to such a configuration, and the connection relation of the capacitor Cst may be varied in accordance with the pixel driving circuit.

The third active layer 311 includes a third channel region 311C implemented using an oxide semiconductor material without being doped with impurities, to be intrinsic, and a third source region 311S and a third drain region 311D which have conductivity through doping thereof with impurities. The third source region 311S and the third drain region 311D are connected to the third source electrode 319S and the third drain electrode 319D, respectively.

Similar to the first source electrode 317S and the first drain electrode 317D, each of the third source electrode 319S and the third drain electrode 319D may be a single layer or multiple layers made of one of molybdenum (Mo), aluminum (Al), chromium (Cr), gold (Au), titanium (Ti), nickel (Ni), neodymium (Nd), and copper (Cu), or an alloy thereof.

The thin film transistor including the oxide semiconductor has a feature of higher on-current than that of the thin film transistor including the polycrystalline semiconductor. Accordingly, when the driving thin film transistor DT is implemented using the oxide semiconductor, it is essentially necessary to increase a threshold voltage of the driving thin film transistor DT in order to achieve a reduction in on-current. In addition, a scheme for enhancing optical reliability of the driving thin film transistor DT for stable long-term driving is needed.

Therefore, an auxiliary active layer 311L, which is made of a polycrystalline semiconductor material, may be disposed under the third active layer 311 of the driving thin film transistor DT according to the embodiment of the present disclosure. The third active layer 311 and the auxiliary active layer 311L are disposed such that one surface of the third active layer 311 and one surface of the auxiliary active layer 311L contact each other over the upper buffer layer 310. As the active layer is formed to have a double-layer structure in which a polycrystalline silicon semiconductor layer and an oxide semiconductor layer overlap each other, the polycrystalline semiconductor material disposed at a lower side reduces or prevents light from being incident upon the oxide semiconductor material, and it may be possible to increase the threshold voltage of the driving thin film transistor DT and to enhance the performance of the driving thin film transistor DT using an increase in flat-band voltage of the polycrystalline semiconductor material. In addition, it may be possible to enhance optical reliability of the driving thin film transistor DT by controlling an incidence amount of light using absorption of light of a visible band equal to or higher than a band gap of the polycrystalline semiconductor material. In this case, the auxiliary active layer 311L may be disposed to completely overlap with at least the third channel region 311C of the third active layer 311.

The auxiliary active layer 311L may be formed on the upper buffer layer 310 using a polycrystalline semiconductor material, and the second active layer 312 and the third active layer 311 may be simultaneously formed on the upper buffer layer 310 and the auxiliary active layer 311L, respectively, using an oxide semiconductor material. In addition, the second gate insulating layer 313 is disposed on the second active layer 312 and the third active layer 311.

Meanwhile, the third source electrode 319S of the driving thin film transistor DT may be electrically connected to the first light shielding layer 308. When the first light shielding layer 308 is disposed in the upper buffer layer 310, and the third source electrode 319S is electrically connected to the first light shielding layer 308, an additional effect may be obtained. This will be described later with reference to FIGS. 5 and 6.

Meanwhile, a first planarization layer 320 and a second planarization layer 322 are sequentially disposed over the pixel driving circuit 370 in order to planarize an upper end of the pixel driving circuit 370. At least one of the first planarization layer 320 and the second planarization layer 322 may be an organic layer. As an example, the organic layer may be made of polyimide or acryl resin.

In addition, the light emitting element EL is formed over the second planarization layer 322.

The light emitting element EL includes the anode 323, the cathode 327, and the light emitting layer 325 disposed between the anode 323 and the cathode 327. When a pixel driving circuit using a low-level voltage VSS in common is implemented, as shown in FIG. 2, the anode 323 is disposed as a separate electrode in each sub-pixel. On the other hand, when a pixel driving circuit using a high-level voltage VDD in common is implemented, the cathode 327 is disposed as a separate electrode in each sub-pixel.

The light emitting element EL is electrically connected to a driving element. As an example, the light emitting element EL may be electrically connected to a driving element via an intermediate electrode 321 disposed on the first planarization layer 320. In detail, the anode 323 of the light emitting element EL and the third drain electrode 319D of the driving thin film transistor DT constituting the pixel driving circuit 370 are interconnected by the intermediate electrode 321.

The anode 323 is connected to the intermediate electrode 321 which is exposed through a first contact hole CH1 extending through the second planarization layer 322. In addition, the intermediate electrode 321 is connected to the third drain electrode 319D which is exposed through a second contact hole CH2 extending through the first planarization layer 320.

The intermediate electrode 321 functions as a medium interconnecting the third drain electrode 319D and the anode 323. The intermediate electrode 321 is formed of a conductive material such as copper (Cu), silver (Ag), molybdenum (Mo) or titanium (Ti). Accordingly, when the intermediate electrode 321 is formed to have a size capable of covering the driving thin film transistor DT, external light incident upon an inside of the display device may be reflected in a scattered manner and, as such, the oxide semiconductor layer of the driving thin film transistor DT may be damaged by internal light. To this end, the intermediate electrode 321 is disposed at a part of the top of the driving thin film transistor DT without completely covering the top of the thin film transistor DT and, as such, reliability of the driving thin film transistor DT is secured.

The anode 323 may be formed to have signal layer or a multilayer structure. As an example, the multilayer structure may include a transparent conductive layer and an opaque conductive layer exhibiting high reflection efficiency. The transparent conductive layer may be made of a material having a relatively great work function value, such as indium tin oxide (ITO) or indium zin oxide (IZO). The opaque conductive layer may be formed to have a single-layer structure or a multilayer structure including aluminum (Al), silver (Ag), copper (Cu), lead (Pb), molybdenum (Mo), titanium (Ti) or an alloy thereof. For example, the anode 323 may be formed to have a structure in which a transparent conductive layer, an opaque conductive layer, and a transparent conductive layer are sequentially stacked or a structure in which a transparent conductive layer and an opaque conductive layer are sequentially stacked.

The light emitting layer 325 may be formed on the anode 323. As an example, the light emitting layer 325 may be formed on the anode 323 in an order of a hole association layer, an organic light emitting layer, and an electron association layer or vice-versa.

A bank layer 324 is a pixel definition layer exposing the anode 323 of each sub-pixel. The bank layer 324 may be formed of an opaque material (for example, a black material) in order to reduce or prevent light interference between adjacent sub-pixels. In this case, the bank layer 324 includes a light shielding material constituted by at least one of a color pigment, an organic black material, and carbon. A spacer 326 may be further disposed on the bank layer 324.

The cathode 327 is formed on an upper surface and a side surface of the light emitting layer 325 while facing the anode 323 under the condition that the light emitting layer 325 is disposed between the cathode 327 and the anode 323. The cathode 327 may be formed in the entirety of an active area such that the cathode 327 has an integrated structure. When the cathode 327 is applied to a top emission type organic light emitting display device, the cathode 327 may be constituted by a transparent conductive layer made of, for example, indium tin oxide (ITO) or indium zinc oxide (IZO).

The encapsulation layer 328, which suppresses or at least reduces moisture penetration, may be further disposed on the cathode 327. The encapsulation layer 328 may include a first inorganic encapsulation layer 328a, a second organic encapsulation layer 328b, and a third inorganic encapsulation layer 328c sequentially stacked in this order.

The first inorganic encapsulation layer 328a and the third inorganic encapsulation layer 328c of the encapsulation layer 328 may be formed of an inorganic material such as silicon oxide ($SiO_x$). The second organic encapsulation layer 328b of the encapsulation layer 328 may be formed of an organic material such as acryl resin, epoxy resin, phenolic resin, polyamide resin, polyimide resin, or the like.

Figure 4:
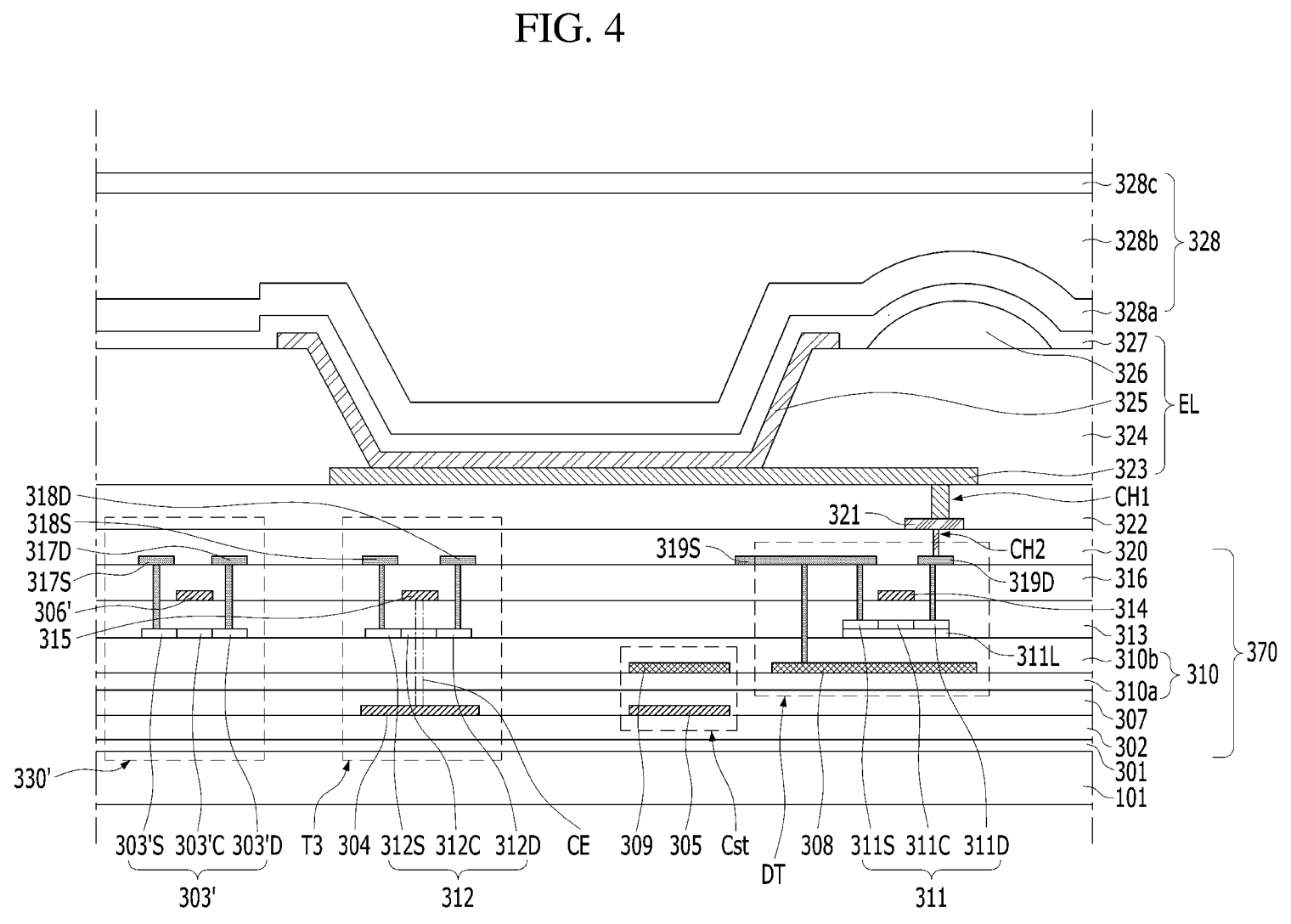

FIG. 4 is a cross-sectional view of a display device according to another embodiment of the present disclosure. The display device of FIG. 4 has the same structure as that of the embodiment of FIG. 3, except for a structure of a polycrystalline switching thin film transistor. Constituent elements of FIG. 4 overlapping with those of FIG. 3 will not be described or will be briefly described.

Referring to FIG. 4, a first active layer 303' of a polycrystalline switching thin film transistor 330' is disposed on the upper buffer layer 310, and a first gate electrode 306' is disposed on the second gate insulating layer 313.

The first active layer 303' of the polycrystalline switching thin film transistor 330' may be formed of the same material as that of the auxiliary active layer 311L of the driving thin film transistor DT through the same process as that of the auxiliary active layer 311L. In addition, the first gate electrode 306' of the polycrystalline switching thin film transistor 330' may be formed of the same material as that of the second gate electrode 315 of the oxide switching thin film transistor T3 and the third gate electrode 314 of the driving thin film transistor DT through the same process as that of the second gate electrode 315 and the third gate electrode 314. As such, it may be possible to reduce the number of mask processes and costs.

The first gate electrode 306' is made of a metal material. For example, the first gate electrode 306' may be a single layer or multiple layers made of one of molybdenum (Mo), aluminum (Al), chromium (Cr), gold (Au), titanium (Ti), nickel (Ni), neodymium (Nd), and copper (Cu), or an alloy thereof, without being limited thereto.

Similar to the embodiment of FIG. 3, the first active layer 303' includes a first channel region 303'C, and a first source region 303'S disposed at one side of the first channel region 303'C and a first drain region 303'D disposed at the other side of the first channel region 303'C under the condition that the first channel region 303'C is disposed therebetween.

Each of the first source region 303'S and the first drain region 303'D is a region having conductivity through doping of an intrinsic polycrystalline semiconductor material with impurity ions, such as group-V or III impurity ions, for example, phosphorous (P) or boron (B) ions.

The first channel region 303'C is a region in which a polycrystalline semiconductor material maintains an intrinsic state, and provides a path through which electrons or holes move. The first source region 303'S and the first drain region 303'D having conductivity are connected to the first source electrode 317S and the first drain electrode 317D, respectively.

In accordance with a variation in position of the polycrystalline switching thin film transistor 330', one of the lower buffer layer 301 and the first gate insulating layer 302 disposed on the substrate 101 may be omitted.

FIG. 5 is a cross-sectional view of a driving thin film transistor according to an exemplary embodiment of the present disclosure. FIG. 6 is a circuit diagram representing a relationship between parasitic capacitances generated in the driving thin film transistor according to the exemplary embodiment of the present disclosure.

Referring to FIGS. 5 and 6, as the third source region 311S and the third drain region 311D of the third active layer 311 formed of an oxide material are doped with impurities and, as such, become conductive, a parasitic capacitance is generated in the third active layer 311. This parasitic capacitance will be referred to as an "active layer parasitic capacitance $C_{act}$." In addition, a parasitic capacitance generated between the third gate electrode 314 and the third active layer 311 will be referred to as an "insulating layer parasitic capacitance $C_{gi}$", and a parasitic capacitance generated between the first light shielding layer 308 electrically connected to the third source electrode 319S and the auxiliary active layer 311L will be referred to as a "buffer layer parasitic capacitance $C_{buf}$".

Since the third active layer 311 and the first light shielding layer 308 are electrically interconnected by the third source electrode 319S, the active layer parasitic capacitance $C_{act}$ and the buffer layer parasitic capacitance $C_{buf}$ are connected in parallel, and the active layer parasitic capacitance $C_{act}$ and the insulating layer parasitic capacitance $C_{gi}$ are connected in series. In addition, when a gate voltage of $V_{gat}$ is applied to the third gate electrode 314, an effective voltage $V_{eff}$ actually applied to the third active layer 311 satisfies the following expression, $$\Delta V_{eff} = \frac{C_{gi}}{C_{gi} + C_{buf} + C_{act}} \times \Delta V_{gat} \qquad \text{[Expression]}$$

The effective voltage $V_{eff}$ applied to the third channel region 311C of the third active layer 311 is inversely proportional to the buffer layer parasitic capacitance $C_{buf}$ and, as such, it may be possible to adjust the effective voltage $V_{eff}$ applied to the third active layer 311 by adjusting the buffer layer parasitic capacitance $C_{buf}$.

Accordingly, when the first light shielding layer 308 is disposed near the third active layer 311, to increase the buffer layer parasitic capacitance $C_{buf}$, it may be possible to reduce an actual value of current flowing through the third active layer 311.

Reduction in the effective value of current flowing through the third active layer 311 means that a control range of the driving thin film transistor DT controllable through the gate voltage $V_{gat}$ applied to the third gate electrode 314 may be widened.

In an embodiment of the present disclosure, it may be possible to widen the grayscale control range of the driving thin film transistor DT by implementing a configuration in which the distance between the first light shielding layer 308 and the third active layer 311 disposed at the driving thin film transistor DT is smaller (e.g., less) than the distance between the second light shielding layer 304 and the second active layer 312 disposed at the oxide switching thin film transistor T3. In addition, since the light emitting element may be precisely controlled at low grayscale, it may be possible to solve a problem or limitation of screen burn-in frequently generated at low grayscale.

FIG. 7 is a cross-sectional view schematically showing a total reflection path of external light in the display device according to an exemplary embodiment of the present disclosure. The cross-sectional view of Fla 7 shows only the driving thin film transistor, the anode 323 and a part of insulating layers in the cross-sectional view of FIG. 3.

An arrow indicated by a dotted line in FIG. 7 represents a path of external light. The arrow represents a path of external light incident upon the driving thin film transistor among various paths. As shown in FIG. 7, the external light incident upon the inside of the display device may be introduced into the third active layer 311 after being reflected by the first light shielding layer 308, the third source electrode 319S, and the third drain electrode 319D. Since the first light shielding layer 308 is widely formed under the third active layer 311 while overlapping with the third active layer 311, light may be introduced into the third active layer 311 by the first light shielding layer 308. To this end, in the display device according to the embodiment of the present disclosure, it pray be possible to reduce or prevent introduction of light to the third active layer 311 by disposing the auxiliary active layer 311L under the third active layer 311. In order to reduce or prevent light from being introduced into the third channel region 311C of the third active layer 311, the auxiliary active layer 311L may have a size capable of completely covering a bottom surface area of the third channel region 311C. Although the size of the auxiliary active layer 311L may be equal to or greater than the size of the third channel region 311C, it is advantageous for the auxiliary active layer 311L to have a size equal to the size of the third active layer 311, taking into consideration processes.

In addition, the auxiliary active layer 311L, which is disposed under and in direct contact with the third active layer 311, is implemented using a polycrystalline semiconductor material and, as such, may absorb wavelengths of a hand gap of 1.12 eV or greater. Accordingly, it may be possible to reduce influence of light introduced from the first light shielding layer 310 into the third active layer 311.

In the driving thin film transistor DT according to the embodiment of the present disclosure, the auxiliary active layer 311L implemented using the polycrystalline, semiconductor material is disposed under the third active layer 311 implemented using the oxide semiconductor material and, as such, an amount of external light introduced into the third active layer 311 may be reduced, thereby securing optical reliability of the driving thin film transistor DT.

Figure 8:
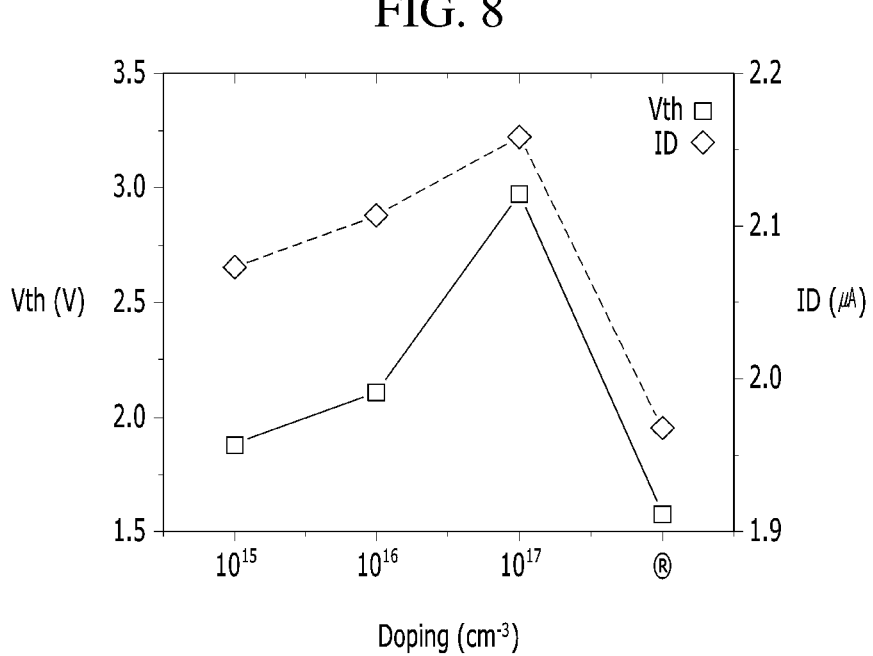
FIG. 8 is a graph depicting a relationship between a threshold voltage and a drive current depending on a doping concentration of the active layer of the driving thin film transistor according to an exemplary embodiment of the present disclosure.

FIG. 8 is a graph depicting a relation between a threshold voltage and drive current depending on a doping concentration of the active layer of the driving thin film transistor according to an embodiment of the present disclosure.

The driving thin film transistor DT according to embodiments of the present disclosure has a structure in which the third active layer 311 made of an oxide semiconductor material and the auxiliary active layer 311L made of a polycrystalline semiconductor material contact each other while overlapping each other.

The third active layer 311 includes the third channel region 311C, and the third source region 311S disposed at one side of the third channel region 311C and a third drain region 311D disposed at the other side of the third channel region 311C under the condition that the third channel region 311C is disposed therebetween.

Each of the third source region 311S and the third drain region 311D may become conductive through doping of an intrinsic oxide semiconductor material with group-V impurity ions, for example, phosphorous (P) ions, in a predetermined concentration. Accordingly, the third active layer 311 may have characteristics of an n-type semiconductor layer, and the third channel region 311C may be maintained in a state in which the oxide semiconductor material is intrinsic, and may provide a path through which electrons move.

The auxiliary active layer 311L is a polycrystalline silicon semiconductor layer. The polycrystalline silicon semiconductor layer may be doped with group-III impurity ions, for example, boron (B) ions, in a predetermined concentration. Accordingly, the auxiliary active layer 311L may have characteristics of a p-type semiconductor layer, and may provide a path through which holes move.

As the third active layer 311 and the auxiliary active layer 311L as described above are bonded to each other, the driving thin film transistor DT may have different kinds of channels. The p-type doped auxiliary active layer 311L provides an auxiliary channel lowering a Fermi-level in the third channel region 311C or a voltage (that is, a body potential) in the entirety of the third channel region 311C and exhibiting high mobility and, as such, may increase both the threshold voltage and the current.

Referring to FIG. 8, the case in which an oxide semiconductor material is used alone as an active layer of a driving thin film transistor DT is designated by ®. A threshold voltage Vth and a value of current ID depending on a doping amount ($10^{15}/cm^{-3}$, $10^{16}/cm^{-3}$, and $10^{17}/cm^{-3}$) of the auxiliary active layer 311L in the driving thin film transistor DT according to the embodiment of the present disclosure in which an active layer having a hetero-junction structure of an oxide semiconductor material and a polycrystalline semiconductor layer is formed are depicted by a graph. Referring to the graph, it may be seen that the threshold voltage Vth and the value of current ID in the case ® are lowest, and, in the case in which the active layer is formed using different kinds of semiconductor materials, the threshold voltage Vth and the value of current ID thereof are relatively increased, and are further increased in accordance with an increase in doping amount.

As the thin film transistor according to the embodiment of the present disclosure includes different kinds of active layers constituted by an n-type semiconductor layer and a p-type semiconductor layer, it may be possible to increase the threshold voltage of the driving thin film transistor, thereby achieving an increase in current. Accordingly, an enhancement in performance of the driving thin film transistor may be achieved.

Display devices according to various embodiments of the present disclosure may be explained as follows.

In accordance with an embodiment of the present disclosure, an organic light emitting display device includes a substrate, a light emitting element disposed on the substrate, and a driving thin film transistor configured to supply drive current to the light emitting element. The driving thin film transistor includes a buffer layer disposed on the substrate, a first polycrystalline silicon semiconductor layer disposed on the buffer layer, a first oxide semiconductor layer contacting the first polycrystalline silicon semiconductor layer while being disposed thereon and comprising a first channel region, a first source region, and a first drain region, a gate insulating layer covering the first oxide semiconductor layer and the first polycrystalline silicon semiconductor layer, a first gate electrode disposed on the gate insulating layer, a first source electrode connected to the first source region, a first drain electrode connected to the first drain region, and a first light shielding layer overlapping with the first oxide semiconductor layer while being disposed thereunder. Accordingly, the driving thin film transistor may secure optical reliability and may achieve an enhancement in performance.

In accordance with another feature of the present disclosure, the first polycrystalline silicon semiconductor layer may be a p-type semiconductor layer, and the first oxide semiconductor layer may be an n-type semiconductor layer.

In accordance with another feature of the present disclosure, the organic light emitting display device may further include a first switching thin film transistor electrically connected to the driving thin film transistor. The first switching thin film transistor may include a second oxide semiconductor layer disposed on the buffer layer, the second oxide semiconductor layer including a second channel region, a second source region, and a second drain region, a second gate electrode disposed on the second oxide semiconductor layer, a second source electrode connected to the second source region, a second drain electrode connected to the second drain region, and a second light shielding layer overlapping with the second oxide semiconductor layer while being disposed thereunder. The first switching thin film transistor may be an n-type transistor.

In accordance with another feature of the present disclosure, the first switching thin film transistor may further include an insulating layer disposed between the second light shielding layer and the buffer layer. The length from the second light shield layer to the second oxide semiconductor layer may be greater than the length from the first light shielding layer to the first polycrystalline silicon semiconductor layer.

In accordance with another feature of the present disclosure, the organic light emitting display device may further include a second switching thin film transistor electrically connected to the driving thin film transistor. The second switching thin film transistor may include a second polycrystalline silicon semiconductor layer disposed on the substrate while including a third channel region, a third source region, and a third drain region, a third gate electrode disposed on the second polycrystalline silicon semiconductor layer, a third source electrode connected to the third source region, and a third drain electrode connected to the third drain region. The second switching transistor may be a p-type transistor.

In accordance with another feature of the present disclosure, the organic light emitting display device may further include a capacitor electrically connected to the driving thin film transistor or the second switching thin film transistor. The capacitor may include a first electrode disposed on the same layer as the first light shielding layer, and a second electrode disposed on the same layer as the third gate electrode.

In accordance with another feature of the present disclosure, the driving thin film transistor may be an n-type transistor.

In accordance with another embodiment of the present disclosure, an organic light emitting display device includes a flexible substrate, a first light shielding layer disposed on the flexible substrate, a first polycrystalline silicon semiconductor layer overlapping with the first light shielding layer while being disposed thereon, a first oxide semiconductor layer contacting the first polycrystalline silicon semiconductor layer while being disposed thereon, a first gate electrode disposed on the first oxide semiconductor layer, a source electrode connected to one side of the first semiconductor layer, and a drain electrode connected to another side of the first semiconductor layer. Accordingly, the driving thin film transistor may secure optical reliability and may achieve an enhancement in performance.

In accordance with another aspect of the present disclosure, the organic light emitting display device may further include a second light shielding layer disposed between the flexible substrate and the first light shielding layer, and a second oxide semiconductor layer overlapping with the second light shielding layer while being disposed thereon and disposed on the same layer as the first oxide semiconductor layer.

In accordance with another aspect of the present disclosure, the distance from the first light shielding layer to the first polycrystalline semiconductor layer may be smaller than the distance from the second light shielding layer to the second oxide semiconductor layer.

In accordance with another aspect of the present disclosure, the organic light emitting display device may further include a first insulating layer disposed under the first polycrystalline silicon semiconductor layer, and a second insulating layer covering a side surface of the first polycrystalline silicon semiconductor layer and an upper portion and a side surface of the first oxide semiconductor layer. The second oxide semiconductor layer may be disposed between the first insulating layer and the second insulating layer.

In accordance with another aspect of the present disclosure, the organic light emitting display device may further include a second gate electrode disposed on the second oxide semiconductor layer. The second gate electrode may be connected to the second light shielding layer.

In accordance with another aspect of the present disclosure, the source electrode may be connected to the first light shielding layer.

In accordance with another aspect of the present disclosure, the organic light emitting display device may further include a first electrode disposed on the same layer as the first light shielding layer and made of the same material as the material of the first light shielding layer, and a second electrode overlapping with the first electrode while being disposed on the same layer as the second light shielding layer and made of the same material as a material of the second light shielding layer. The first electrode may be electrically connected to the first gate electrode, and the second electrode may be connected to a high-level voltage line.

In accordance with an embodiment of the present disclosure, a driving circuit may be implemented to include a driving thin film transistor and a switching thin film transistor including an oxide semiconductor and, as such, it may be possible to reduce leakage current in a turn-off state of the thin film transistors and to reduce power consumption.

In accordance with an embodiment of the present disclosure, a driving thin film transistor includes an oxide semiconductor and, as such, it may be possible to reduce an effective voltage generated at the oxide semiconductor through adjustment of a parasitic capacitance. Accordingly, it may be possible to achieve precise grayscale expression at low grayscale and to reduce failure such as screen burn-in or the like in an organic light emitting display device.

In accordance with an embodiment of the present disclosure, a polycrystalline silicon semiconductor layer may be disposed under an oxide semiconductor layer of a driving thin film transistor and, as such, an increase in threshold voltage may be achieved. Accordingly, the performance of the driving thin film transistor may be enhanced.

As the polycrystalline silicon semiconductor layer is disposed under the oxide semiconductor layer of the driving thin film transistor in accordance with the embodiment of the disclosure, it may be possible to secure optical reliability through control of an amount of light introduced into the oxide semiconductor layer of the driving thin film transistor.

Effects of the present disclosure are not limited to the above-described effects. Other effects not described in the present disclosure may be readily understood by those skilled in the art from the appended claims.

It will be appreciated that the technical spirit of the present disclosure has been described herein only for purposes of illustration through the above description and the accompanying drawings, and that combination, separation, substitution, and modifications of components may be made by those skilled in the art without departing from the scope and spirit of the present disclosure. Therefore, the embodiments of the present disclosure are provided for illustrative purposes only and are not intended to limit the technical spirit of the present disclosure. The scope of the technical spirit of the present disclosure is not limited thereto. The protection scope of the present disclosure should be interpreted based on the appended claims, and it should be appreciated that all technical ideas falling within a range equivalent to the claims are included in the protection scope of the present disclosure.

What is claimed is:

1. An organic light emitting display device comprising:
   a substrate;
   a light emitting element on the substrate; and a driving thin film transistor configured to supply drive current to the light emitting element, wherein the driving thin film transistor comprises:

a first polycrystalline silicon semiconductor layer on the substrate, the first polycrystalline silicon semiconductor layer doped with group-III impurity ions;

a first oxide semiconductor layer on the first polycrystalline silicon semiconductor layer, the first oxide semiconductor layer contacting the first polycrystalline silicon semiconductor layer and comprising a first channel region, a first source region, and a first drain region;

a gate insulating layer on the first oxide semiconductor layer and the first polycrystalline silicon semiconductor layer;

a first gate electrode on the gate insulating layer;

a first source electrode connected to the first source region; and a first drain electrode connected to the first drain region, wherein the first polycrystalline silicon semiconductor layer is a p-type semiconductor layer, and the first oxide semiconductor layer is an n-type semiconductor layer.

2. The organic light emitting display device according to claim 1, wherein the driving thin film transistor further comprises:

a first light shielding layer under the first oxide semiconductor layer, the first light shielding layer overlapping with the first oxide semiconductor layer.

3. The organic light emitting display device according to claim 2, further comprising:

a first switching thin film transistor including an oxide semiconductor as an active layer thereof.

4. The organic light emitting display device according to claim 3, wherein the first switching thin film transistor comprises:

a second oxide semiconductor layer on the substrate, the second oxide semiconductor layer comprising a second channel region, a second source region, and a second drain region;

a second gate electrode on the second oxide semiconductor layer;

a second source electrode connected to the second source region;

a second drain electrode connected to the second drain region; and a second light shielding layer under the second oxide semiconductor layer, the second light shielding layer overlapping with the second oxide semiconductor layer.

5. The organic light emitting display device according to claim 4, wherein the first switching thin film transistor is an n-type transistor.

6. The organic light emitting display device according to claim 4, wherein the first switching thin film transistor further comprises:

an insulating layer above the second light shielding layer and below the first light shielding layer.

7. The organic light emitting display device according to claim 4, wherein a distance from the second light shielding layer to the second oxide semiconductor layer is greater than a distance from the first light shielding layer to the first polycrystalline silicon semiconductor layer.

8. The organic light emitting display device according to claim 4, wherein the first switching thin film transistor is electrically connected to the driving thin film transistor.

9. The organic light emitting display device according to claim 8, wherein the second source electrode is connected to the first source electrode, the second drain electrode is connected to the first gate electrode, and the second gate electrode is configured to receive a scan signal.

10. The organic light emitting display device according to claim 4, wherein the driving thin film transistor further comprises:

a buffer layer on the substrate, wherein the second oxide semiconductor layer and the first oxide semiconductor layer are on the buffer layer and the first polycrystalline silicon semiconductor layer, respectively, using a same material.

11. The organic light emitting display device according to claim 2, further comprising:

a second switching thin film transistor including polycrystalline silicon semiconductor as an active layer thereof.

12. The organic light emitting display device according to claim 11, wherein the second switching thin film transistor comprises:

a second polycrystalline silicon semiconductor layer on the substrate, the second polycrystalline silicon semiconductor layer comprising a third channel region, a third source region, and a third drain region;

a third gate electrode on the second polycrystalline silicon semiconductor layer;

a third source electrode connected to the third source region; and a third drain electrode connected to the third drain region.

13. The organic light emitting display device according to claim 12, wherein the second switching thin film transistor is a p-type transistor.

14. The organic light emitting display device according to claim 12, further comprising:

a capacitor electrically connected to the driving thin film transistor, wherein the capacitor comprises a first electrode disposed on a same layer as the first light shielding layer, and a second electrode disposed on a same layer as the third gate electrode.

15. The organic light emitting display device according to claim 12, wherein the second polycrystalline silicon semiconductor layer and the first polycrystalline silicon semiconductor layer comprise a same material and are on a same layer.

16. The organic light emitting display device according to claim 11, wherein the second switching thin film transistor is one of a transistor configured to supply a data voltage to the first drain electrode of the driving thin film transistor, a transistor configured to supply an initialization voltage to the first source electrode of the driving thin film transistor, a transistor configured to supply a high-level voltage to the first drain electrode of the driving thin film transistor, a transistor connected between the driving thin film transistor and the light emitting element, or a transistor configured to supply an anode reset voltage to an anode of the light emitting element.

17. The organic light emitting display device according to claim 2, wherein the first source electrode is electrically connected to the first light shielding layer.

18. The organic light emitting display device according to claim 1, wherein the driving thin film transistor is an n-type transistor.

19. The organic light emitting display device according to claim 1, wherein a size of the first polycrystalline silicon semiconductor layer is equal to or greater than a size of the first channel region.

20. An organic light emitting display device comprising:

a substrate;

a first light shielding layer on the substrate;

a first polycrystalline silicon semiconductor layer on the first light shielding layer, the first polycrystalline silicon semiconductor layer overlapping with the first light shielding layer, the first polycrystalline silicon semiconductor layer doped with group-III impurity ions;

a first oxide semiconductor layer on the first polycrystalline silicon semiconductor layer, the first oxide semiconductor layer contacting the first polycrystalline silicon semiconductor layer;

a first gate electrode on the first oxide semiconductor layer;

a source electrode connected to one side of the first oxide semiconductor layer; and a drain electrode connected to another side of the first oxide semiconductor layer, wherein the first polycrystalline silicon semiconductor layer is a p-type semiconductor layer, and the first oxide semiconductor layer is an n-type semiconductor layer.

21. The organic light emitting display device according to claim 20, further comprising:

a second light shielding layer disposed on the substrate, the second light shielding layer spaced apart from the first light shielding layer in a direction parallel to a surface of the substrate, and the second light shielding layer disposed closer to the substrate than the first light shielding layer; and a second oxide semiconductor layer on the second light shielding layer, the second oxide semiconductor layer overlapping with the second light shielding layer, wherein the second oxide semiconductor layer is disposed on a same layer as the first oxide semiconductor layer.

22. The organic light emitting display device according to claim 21, wherein a distance from the first light shielding layer to the first polycrystalline silicon semiconductor layer is less than a distance from the second light shielding layer to the second oxide semiconductor layer.

23. The organic light emitting display device according to claim 21, further comprising:

a first insulating layer under the first polycrystalline silicon semiconductor layer; and a second insulating layer covering a side surface of the first polycrystalline silicon semiconductor layer and an upper portion and a side surface of the first oxide semiconductor layer.

24. The organic light emitting display device according to claim 23, wherein the second oxide semiconductor layer is between the first insulating layer and the second insulating layer.

25. The organic light emitting display device according to claim 21, further comprising:

a second gate electrode on the second oxide semiconductor layer, wherein the second gate electrode is connected to the second light shielding layer.

26. The organic light emitting display device according to claim 20, wherein the source electrode is connected to the first light shielding layer.

27. The organic light emitting display device according to claim 26, wherein an effective voltage applied to a channel region of the first oxide semiconductor layer is inversely proportional to a parasitic capacitance between the first light shielding layer and the first polycrystalline silicon semiconductor layer.

28. The organic light emitting display device according to claim 20, further comprising:

a first electrode disposed on a same layer as the first light shielding layer, the first electrode including a same material as the first light shielding layer; and a second electrode overlapping with the first electrode, the second electrode on a same layer as a second light shielding layer and including a same material as the second light shielding layer.

29. The organic light emitting display device according to claim 28, wherein the first electrode is electrically connected to the first gate electrode, and the second electrode is connected to a high-level voltage line.

* * * * *